(12) United States Patent
Poletto et al.

(10) Patent No.: US 8,872,682 B2
(45) Date of Patent: Oct. 28, 2014

(54) ANALOG-TO-DIGITAL CONVERSION LOOP FOR PS15 AND WSS SYSTEMS

(71) Applicant: STMicroelectronics S.r.l, Agrate Brianza (IT)

(72) Inventors: Vanni Poletto, Casale Monferrato (IT); Carlo Antonini, Venegono Inferiore (IT); Salvatore Cannavacciuolo, Cornaredo (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 0 days.

(21) Appl. No.: 13/926,455

(22) Filed: Jun. 25, 2013

(65) Prior Publication Data

US 2013/0342376 A1   Dec. 26, 2013

(30) Foreign Application Priority Data

Jun. 26, 2012   (IT) .......................... MI2012A001116

(51) Int. Cl.
| | |
|---|---|
| *H03M 1/00* | (2006.01) |
| *H03M 1/12* | (2006.01) |
| *H03M 3/04* | (2006.01) |
| *H03M 1/48* | (2006.01) |

(52) U.S. Cl.
CPC . *H03M 1/12* (2013.01); *H03M 1/48* (2013.01); *H03M 1/1235* (2013.01); *H03M 3/04* (2013.01)
USPC ............................ 341/138; 341/155; 341/120

(58) Field of Classification Search
CPC ....................................................... H03M 1/12
USPC .......................... 341/155, 138, 118, 143, 120
See application file for complete search history.

(56) References Cited

U.S. PATENT DOCUMENTS

| | | | | |
|---|---|---|---|---|
| 6,016,112 A | * | 1/2000 | Knudsen | 341/118 |
| 6,100,834 A | * | 8/2000 | Lewyn | 341/155 |
| 6,229,469 B1 | * | 5/2001 | Gaudet | 341/143 |

(Continued)

FOREIGN PATENT DOCUMENTS

GB   2101435   1/1983

OTHER PUBLICATIONS

Italian Search Report and Written Opinion dated Nov. 14, 2012 from corresponding Italian Application No. MI2012A001116.

(Continued)

*Primary Examiner* — Jean B Jeanglaude
(74) *Attorney, Agent, or Firm* — Wolf, Greenfield & Sacks, P.C.

(57) ABSTRACT

An analog-to-digital conversion loop adapted to generate a digital output signal corresponding to a low-pass filtered replica of an analog input signal, including an analog adder configured to receive the input analog signal and an analog feedback signal, adapted to generate an analog error signal corresponding to the difference between the analog input signal and the analog feedback signal; an analog-to-digital converter having a nonlinear input-output conversion characteristic defining a larger quantization step the more the input to be converted differs from a null value, configured to receive the analog error signal and to generate a corresponding digital error signal a digital integrator configured to receive the digital error signal, configured to generate the digital output signal corresponding to the time integration of the digital error signal; a digital-to-analog converter, configured to receive the digital output signal and to generate the analog feedback signal as analog replica of the digital output signal.

9 Claims, 17 Drawing Sheets

(56) References Cited

U.S. PATENT DOCUMENTS

| | | | |
|---|---|---|---|
| 6,653,968 B1* | 11/2003 | Schneider | 341/178 |
| 7,068,193 B2* | 6/2006 | Dempsey et al. | 341/120 |
| 7,176,819 B1* | 2/2007 | Swerlein et al. | 341/143 |
| 7,821,434 B2* | 10/2010 | Huppertz | 341/120 |
| 7,906,976 B2* | 3/2011 | Remmers et al. | 324/686 |
| 7,944,385 B2* | 5/2011 | Le Guillou | 341/143 |
| 8,203,471 B2* | 6/2012 | Motz et al. | 341/110 |
| 2003/0128143 A1* | 7/2003 | Yap et al. | 341/143 |
| 2009/0135033 A1* | 5/2009 | Huppertz | 341/118 |
| 2011/0296065 A1* | 12/2011 | Daecke et al. | 710/61 |

OTHER PUBLICATIONS

Guilherme, J., et al., A True Logarithmic Analog-To-Digital Pipeline Converter With 1.5 Bit/Stage and Digital Correction, Electronics, Circuits and Systems, 2001. ICEC 2001. The 8th IEEE International conference on Sep. 2-5, 2001, Piscataway, NJ, IEEE, Piscataway, NJ, vol. 1, Sep. 2, 2001, pp. 393-396, XP010563017.

* cited by examiner

ANALOG-TO-DIGITAL CONVERSION LOOP FOR PSI5 AND WSS SYSTEMS

CROSS REFERENCE TO RELATED APPLICATIONS

This application claims the priority benefit of Italian patent application serial number MI2012A001116, filed Jun. 26, 2012, which is hereby incorporated by reference to the maximum extent allowable by law.

BACKGROUND

1. Technical Field

This disclosure relates to analog-to-digital converters and more particularly to an integrated analog-to-digital converter having an improved accuracy and a reduced silicon area occupation, particularly suited for PSI5 and WSS (Wheel Speed Sensor) systems, and a related interface for PSI5 and WSS systems.

2. Discussion of the Related Art

Analog-to-digital converters are electronic devices even more frequently used in the automotive field for realizing interfaces of analog sensors installed in vehicles to a central control unit. In particular, the so-called PSI5 (Peripheral Sensor Interface) is even more used, for example, in combination with airbag sensors, and are characterized by limited costs, high speed and reliability of the data transfer and low overhead.

A typical example of a control system made of sensors connected to an electronic control unit (ECU) having a PSI5 interface is depicted in FIG. 1. The communication channel between the sensors and the electronic control unit of a PSI5 system may be basically represented as shown in FIG. 2. A typical electric diagram of a PSI5 or WSS (Wheel Speed Sensor) sensor and of the connection bus to the demodulator and decoder is shown in FIG. 3.

Nowadays, the most effective solution for processing a received analog signal consists substantially in converting the analog signal into a digital signal and in carrying out a demodulation of the digital data such to obtain a bit sequence adapted to be processed directly by a controller or a microprocessor for implementing a desired control action.

Downstream from the analog-to-digital converter, at least an anti-aliasing filter is typically provided for canceling conversion noise, such to prevent it from disturbing the demodulated noise. In PSI5 or WSS (Wheel Speed Sensor) systems, it is desirable to carry out fast analog-to-digital conversions and the successive low-pass filtering and to make these operations relatively robust against noise.

An analog-to-digital conversion loop has a feedback line including a digital-to-analog converter that provides an analog replica of the generated digital signal. Because of design constraints of the above mentioned systems, it is particularly important to realize this feedback loop such to obtain an output that goes quickly to the desired level corresponding to the time-varying analog input signal.

U.S. Pat. No. 6,229,469 shows an analog-to-digital conversion loop, shown in FIG. 4, wherein the input analog signal to be converted is compared with an analog amplified replica of the digital output signal. The difference between the two analog signals, that constitutes an output correction (increase or decrease) signal, is amplified and converted by a linear flash analog-to-digital converter, that generates increment or decrement digital values of an up or down counter, that on its turn generates the digital output corresponding to the analog input signal. The up/down counter practically carries out a low-pass filtering because in the digital domain its function substantially is that of a digital integrator, that reduces noise on the digital output.

A limitation of this analog-to-digital conversion loop consists in that it needs a sample and hold circuit in order to function correctly in presence of large variations of the input signal. Moreover, the used flash analog-to-digital converter is linear. Therefore, its architecture is as shown in FIG. 5, that requires a silicon area that increase with an exponential law with the number N of bits, and thus with the accuracy, of the output digital word DOUT.

The sample and hold circuit is needed in this architecture because it holds the analog error signal for the time necessary to allow the propagation thereof throughout the comparators, the encoder and the output buffer. If the sample and hold circuit were removed, then, in presence of a time varying input signal, the output buffer would upload a digital datum while the input is changing, thus causing errors that may be relevant.

Another known solution is depicted in FIG. 6 and is disclosed on the web-page www.echoescan.com/Predictor.htm. It is characterized by the presence in the digital domain on the feedback line of an error prediction filter. The output of this analog-to-digital conversion loop is high-pass and needs an amplifier GAIN and an analog-to-digital converter ADC inserted in the direct path with restrictive constraints of accuracy, because the accuracy may greatly influence the characteristics of the output signal.

U.S. Pat. No. 6,100,834 discloses an analog-to-digital conversion loop, shown in FIG. 7, wherein an adder 100 generates a correction signal given by the difference between an analog input signal to be converted Vin and an analog feedback signal corresponding to the digital output OUT. A high-pass filter generates a filtered replica S1 of the correction signal, that is thus converted in the digital domain by a flash linear analog-to-digital converter.

A drawback of this analog-to-digital conversion loop consists in the presence of the high-pass filter, that is relatively complex to realize. Moreover, the flash analog-to-digital converter should be particularly fast to generate an accurate digital replica of the high-pass signal S1, otherwise the depicted conversion loop would not function correctly because it does not have the sample and hold circuit, necessary for keeping constant the input of the converter for the time necessary to carry out the conversion.

FIGS. 8a and 8b depict known current sensing architectures of PSI5 and WSS sensors, that have a threshold-based discrimination system. They substantially compare a current ISat/100, that represents an analog quantity to be converted, with a threshold current determined by a logic circuit able to define the range to which the current belongs.

The architecture of FIG. 8a has a digital-to-analog feedback loop that allows tracking the average current of a PSI5 bus; a control logic is adapted to determine whether the instantaneous current through the bus exceeds or not a fixed threshold summed to the above average current. This allows locating the modulation edges. The scheme of FIG. 8b implements a digital-to-analog feedback loop that is able to discriminate, by means of three fixed additive thresholds, to which of the ranges of interest the instantaneous current of the bus belongs, thus allowing decoding of the modulation.

Even if the depicted circuits have a relatively fast transient response, they occupy a relevant silicon area and further they do not have a good noise rejection.

It would be desirable to have a sufficiently fast analog-to-digital conversion loop that may be embedded in PSI5 or WSS systems, that occupies a reduced silicon area and that has a good noise rejection.

SUMMARY

Studies carried out by the Applicant aimed to find a solution that satisfies all the above requirements, apparently incompatible, led to the realization of an innovative analog-to-digital conversion loop wherein the analog-to-digital converter has a nonlinear input-output conversion characteristic with a larger quantization step the more the input to be converted differs from a null value, such to analog-to-digital convert in a refined manner during quasi steady-state conditions, when the analog error signal is practically null, and in a relatively coarse manner during transient conditions.

The applicant has found that such an embodiment of an analog-to-digital conversion loop is particularly suited for interfaces of PSI5 or WSS systems because they are characterized by substantially square wave input signals to be converted. In these interfaces it is thus required to make the digital output tend quickly to the analog input signal to be converted when the latter switches, though the accuracy of the conversion in transient conditions, that is when the signal switches from a level to another, is not a strict requirement.

Thus, an embodiment provides an analog-to-digital conversion loop comprising:
- an analog adder configured to receive the analog input signal and a feedback signal, adapted to generate an analog error signal corresponding to the difference between the analog input signal and the analog feedback signal;
- an analog-to-digital converter having a nonlinear input-output conversion characteristic defining a larger quantization step the more the input to be converted differs from a null value, configured to receive the analog error signal and adapted to generate a corresponding digital error signal;
- a digital integrator configured to receive the digital error signal, adapted to generate the output digital signal corresponding to the time integration of the digital error signal;
- a digital-to-analog converter, configured to receive the digital output signal and adapted to generate the analog feedback signal as analog replica of the digital output signal.

According to an embodiment, the analog-to-digital converter has a logarithmic characteristic and the digital integrator is a counter.

The herein proposed conversion loop may be embedded in PSI5 interfaces or in interfaces adapted to be connected to WSS sensors.

The claims as filed are integral part of this description and are herein incorporated by reference.

DETAILED DESCRIPTION

Figure 9:
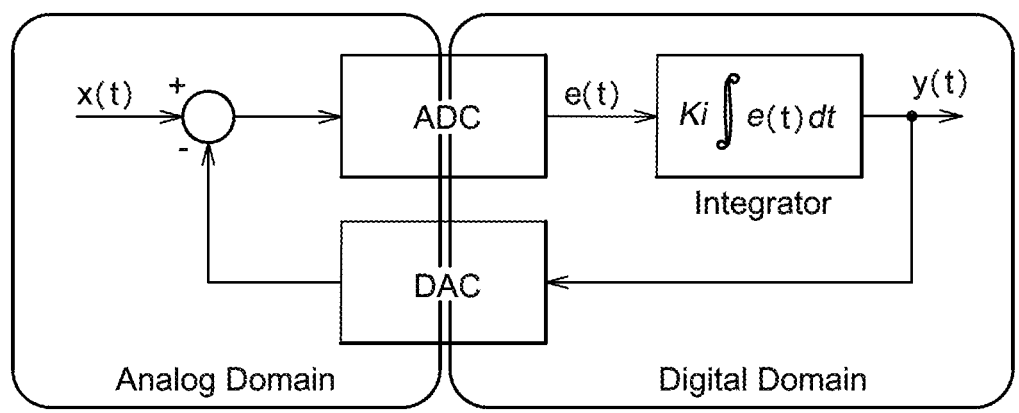
FIG. 9 shows a functional scheme of the analog-to-digital conversion loop according to this disclosure.

A basic diagram of the herein proposed analog-to-digital conversion loop is shown in FIG. 9. It is designed to carry out the analog-to-digital conversion at a relatively high frequency and to carry out a low-pass filtering in the digital domain along the direct path of the loop for removing high frequency noise.

Figure 1:
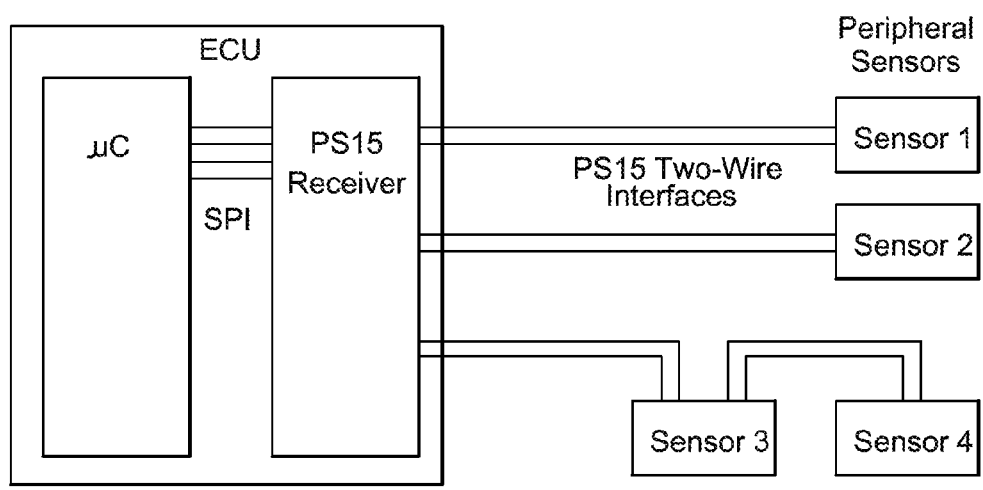
FIG. 1 is a basic block diagram of a PSI5 system.
Figure 2:
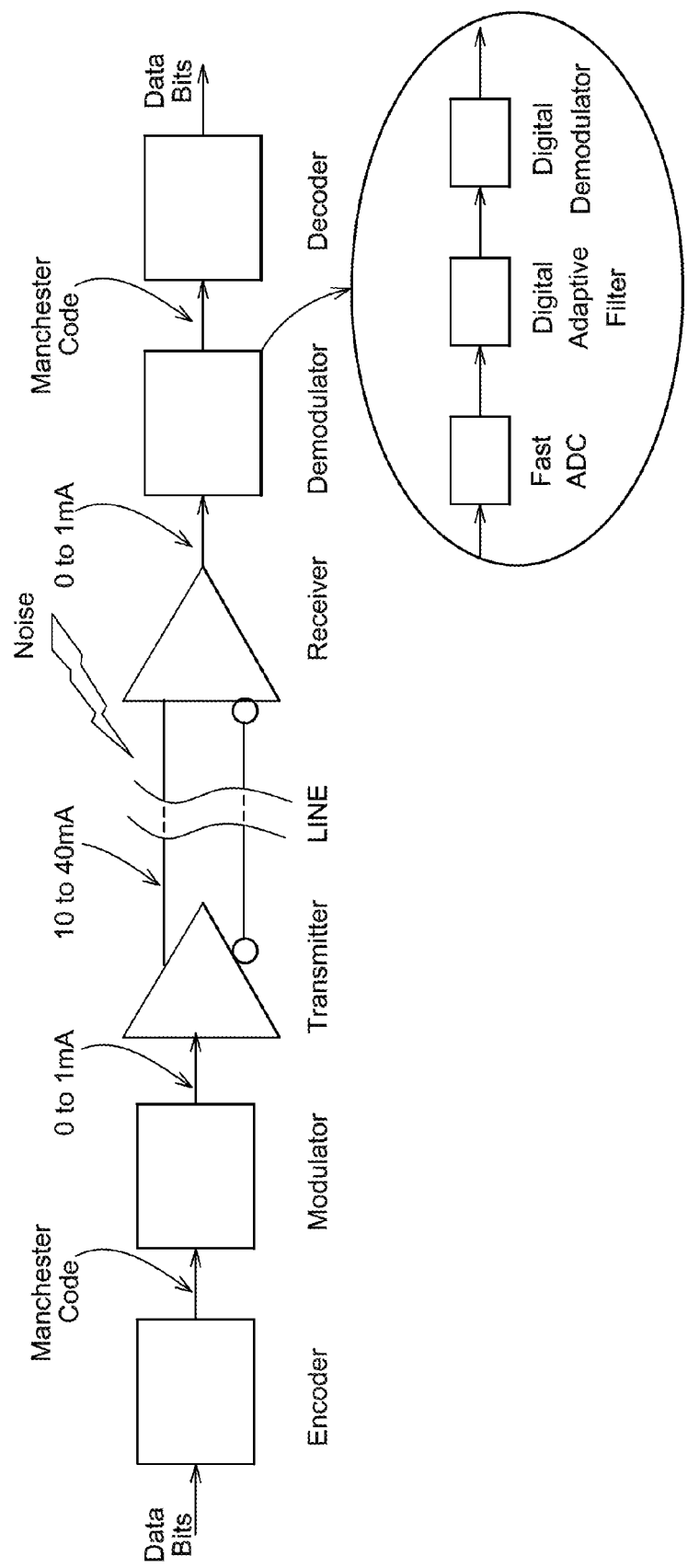
FIG. 2 shows a communication channel representing a PSI5 system.
Figure 3:
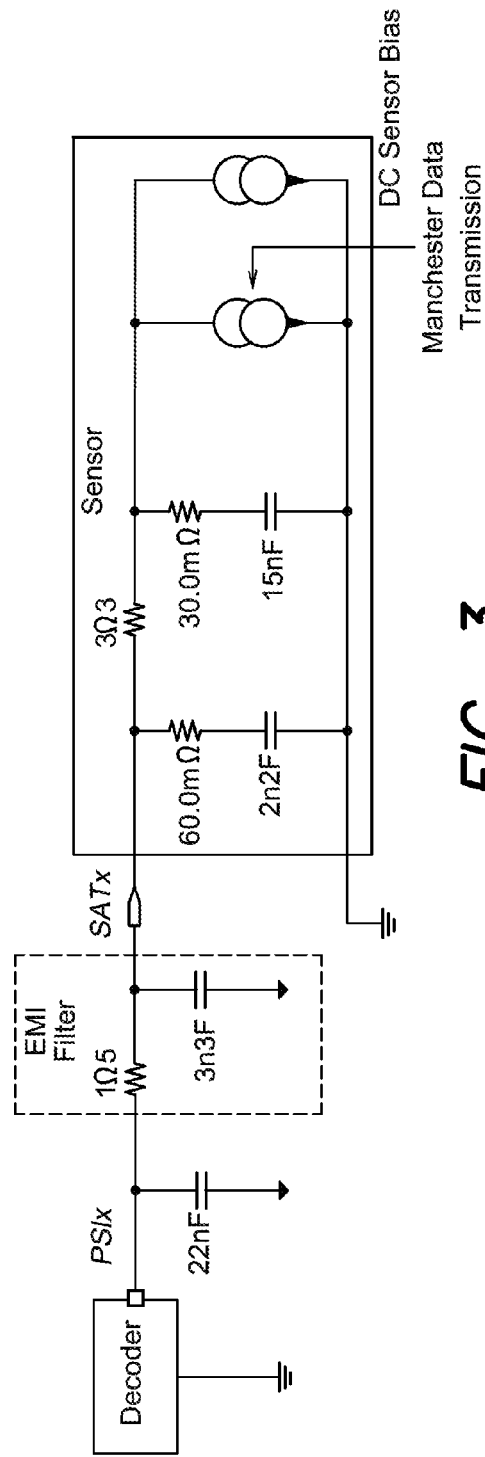
FIG. 3 depicts an equivalent electric circuit of a sensor connected to a decoder in a PSI5 system.
Figure 4:
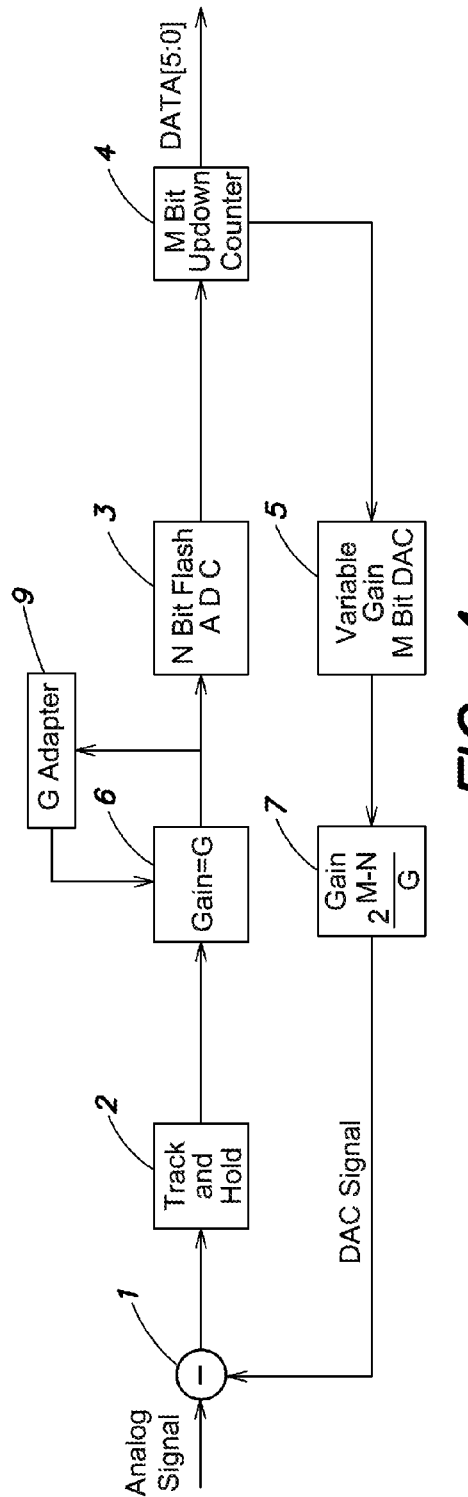
FIG. 4 depicts an analog-to-digital conversion loop shown in U.S. Pat. No. 6,229,469.

A difference between the novel analog-to-digital conversion loop and the prior loop shown in FIG. 4, comprises that the analog-to-digital converter is realized such to have a nonlinear input-output characteristic that defines a larger quantization step the more the input to be converted differs from a null value. as will be shown hereinafter, the novel conversion loop does not require the presence of a sample and hold circuit, it occupies a relatively small silicon area, it has fast transient responses and provides a high accuracy in correspondence of values in quasi-stationary functioning conditions.

The input of the analog-to-digital converter is substantially an error signal, that in steady-state conditions is null because of the integrator in the feedback loop, thus it is sufficient to perform an accurate conversion only in correspondence of the null value of the error signal in order to have an analog-to-digital conversion loop adapted to be used in all applications, such as the PSI5 and WSS systems, in which accuracy in transient conditions is not a strict requirement.

With the same number of comparators of the analog-to-digital converter, a better accuracy in quasi-steady state conditions is obtained with a converter with a nonlinear conversion characteristic than with a converter with a linear conversion characteristic. Moreover, using a nonlinear converter, it is not necessary to use a sample and hold circuit, when the conversion loop is to be embedded in a PSI5 or WSS system. Indeed, without this sample and hold circuit there is a relevant error during transient conditions, though in PSI5 or WSS systems this transient error has no or little influence on the functioning of the system in which the loop is embedded, because in quasi steady-state conditions the output is an accurate digital replica of the analog input.

Tests carried out by the applicant have shown that analog-to-digital converters with a logarithmic input-output characteristic are particularly suited for the application. For this reason, in the ensuing description reference will be made to this particular embodiment, though what will be stated holds mutatis mutandis also for nonlinear converters of other types.

According to an embodiment, that is particularly easy to implement, the integrator is substantially a counter or a digital circuit configured to carry out the same function.

Figure 10:
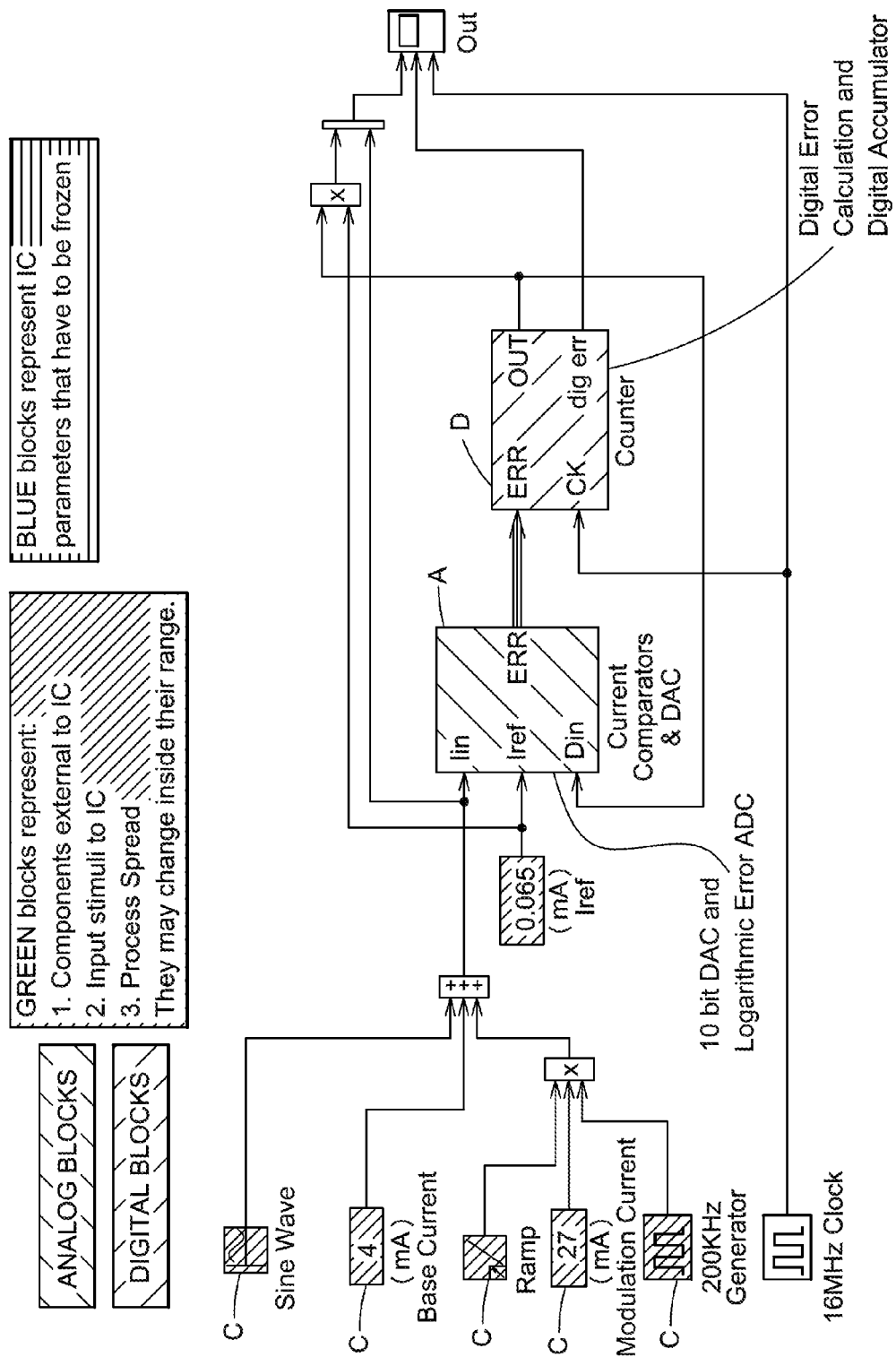
FIG. 10 shows an embodiment of an analog-to-digital conversion loop according to this disclosure.

An exemplary block diagram of the novel analog-to-digital conversion loop is shown in FIG. 10. It is substantially a Simulink™ implementation of the proposed conversion loop, being A and D the parts of the algorithm that are implemented in analog form (10 bit DAC and Logarithmic error ADC) and in digital form (accumulator). The blocks used as control stimuli, that may be adjusted by users, are labeled with the letter C.

Figure 5:
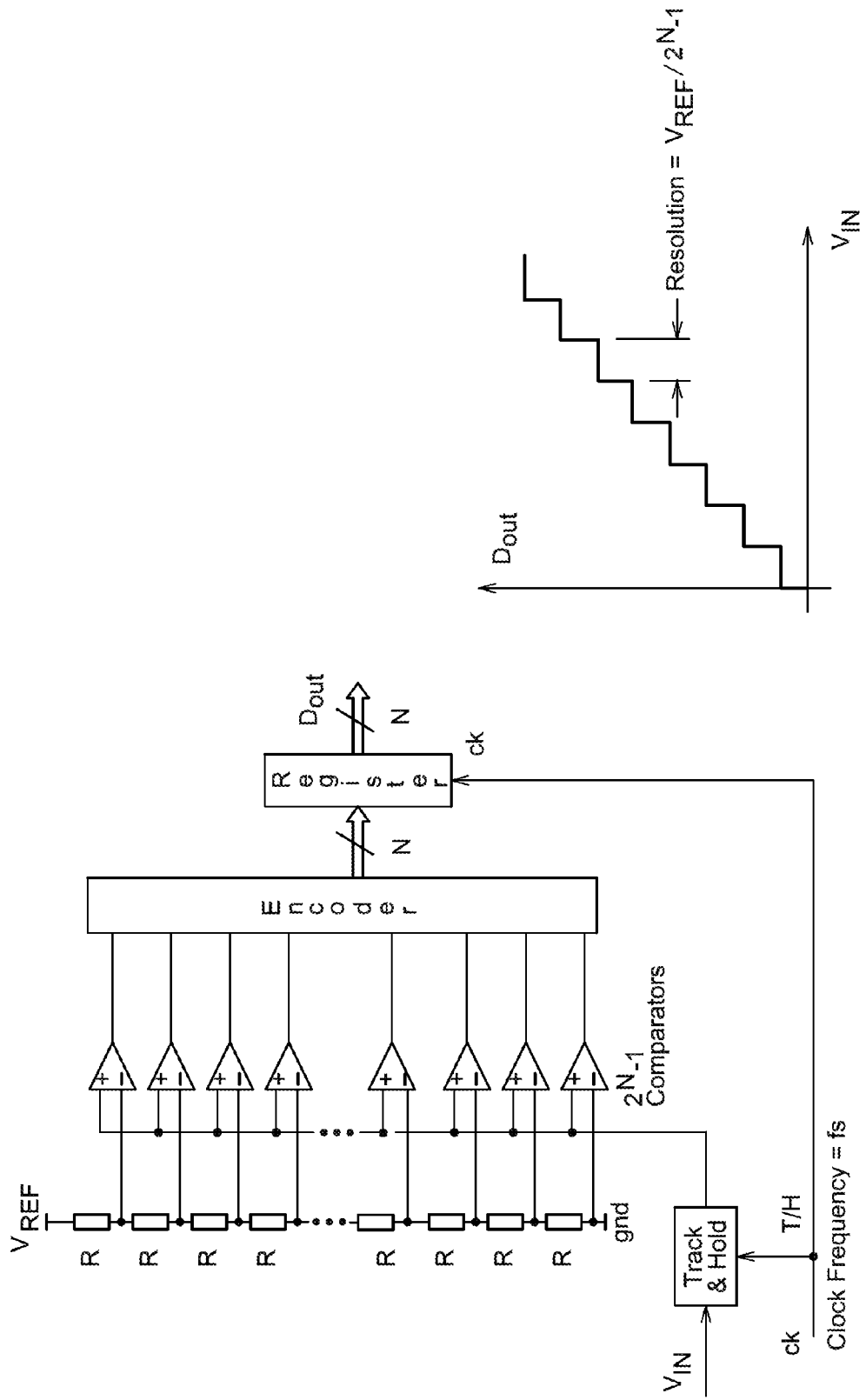
FIG. 5 shows a flash linear analog-to-digital converter and its relative input-output characteristic.
Figure 6:
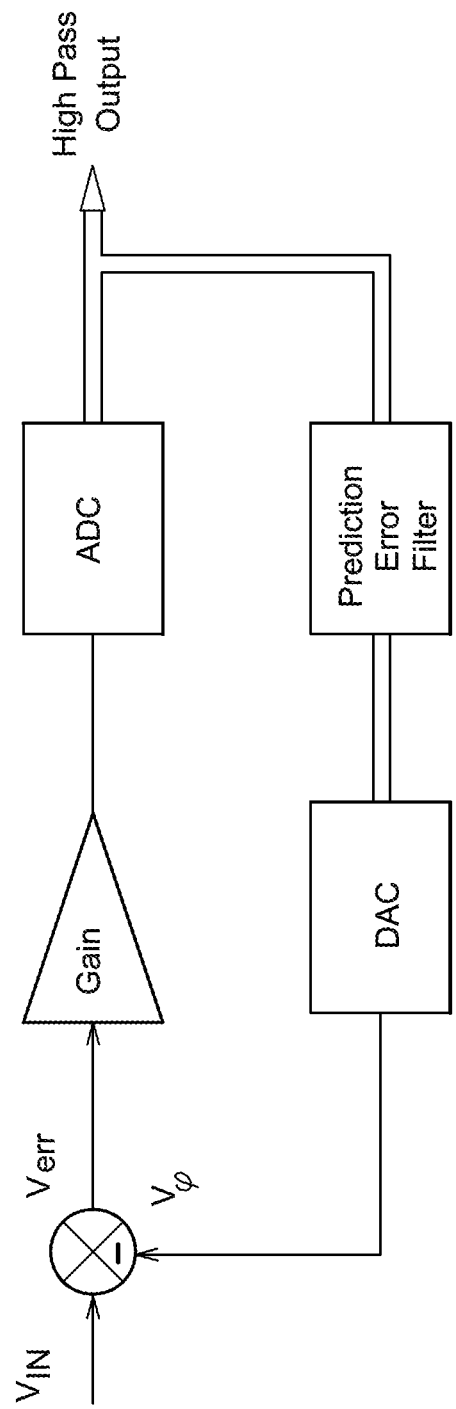
FIG. 6 depicts another prior analog-to-digital conversion loop.
Figure 7:
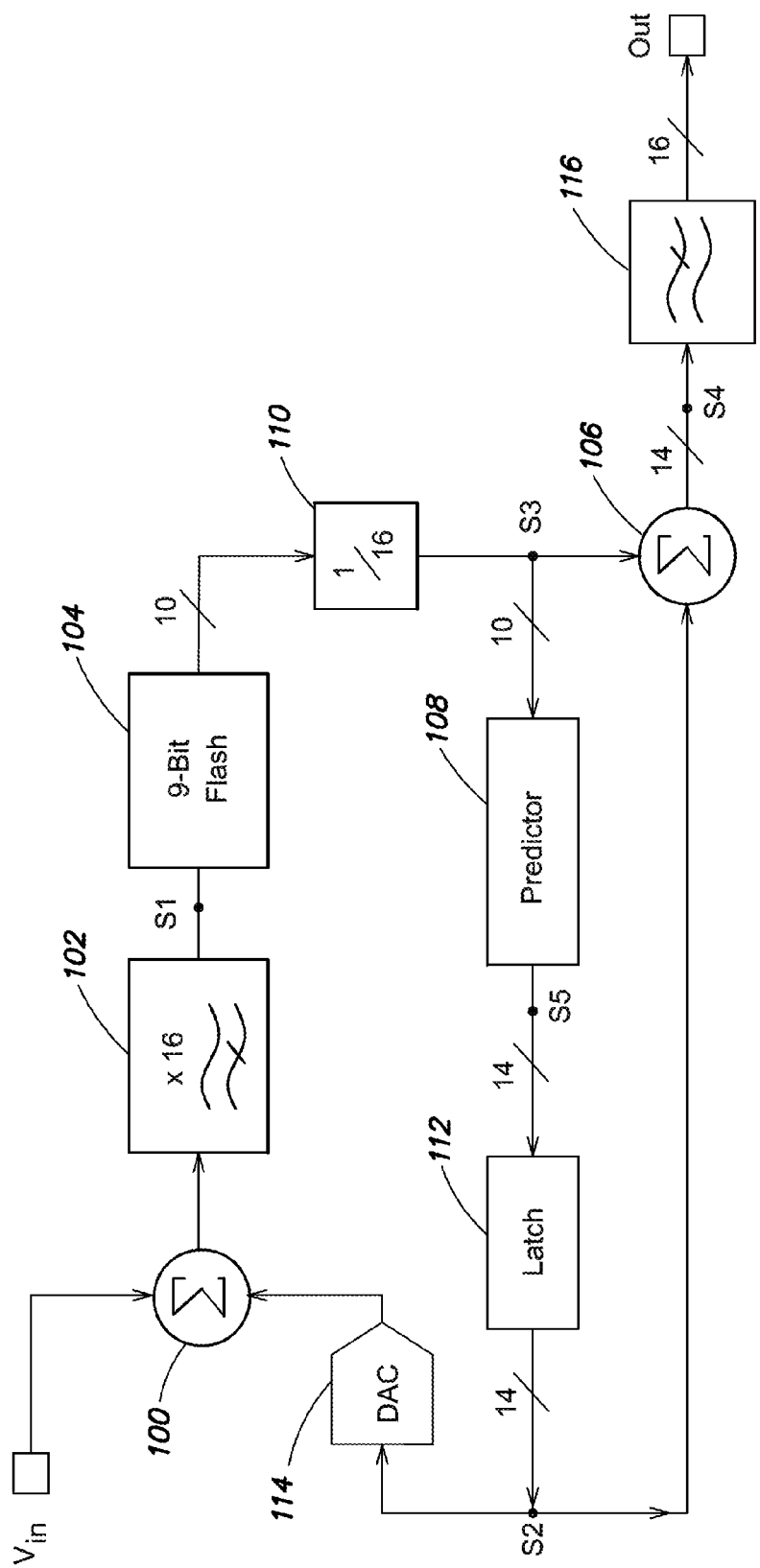
FIG. 7 depicts an analog-to-digital conversion loop disclosed in U.S. Pat. No. 6,100,834.
Figure 8A:
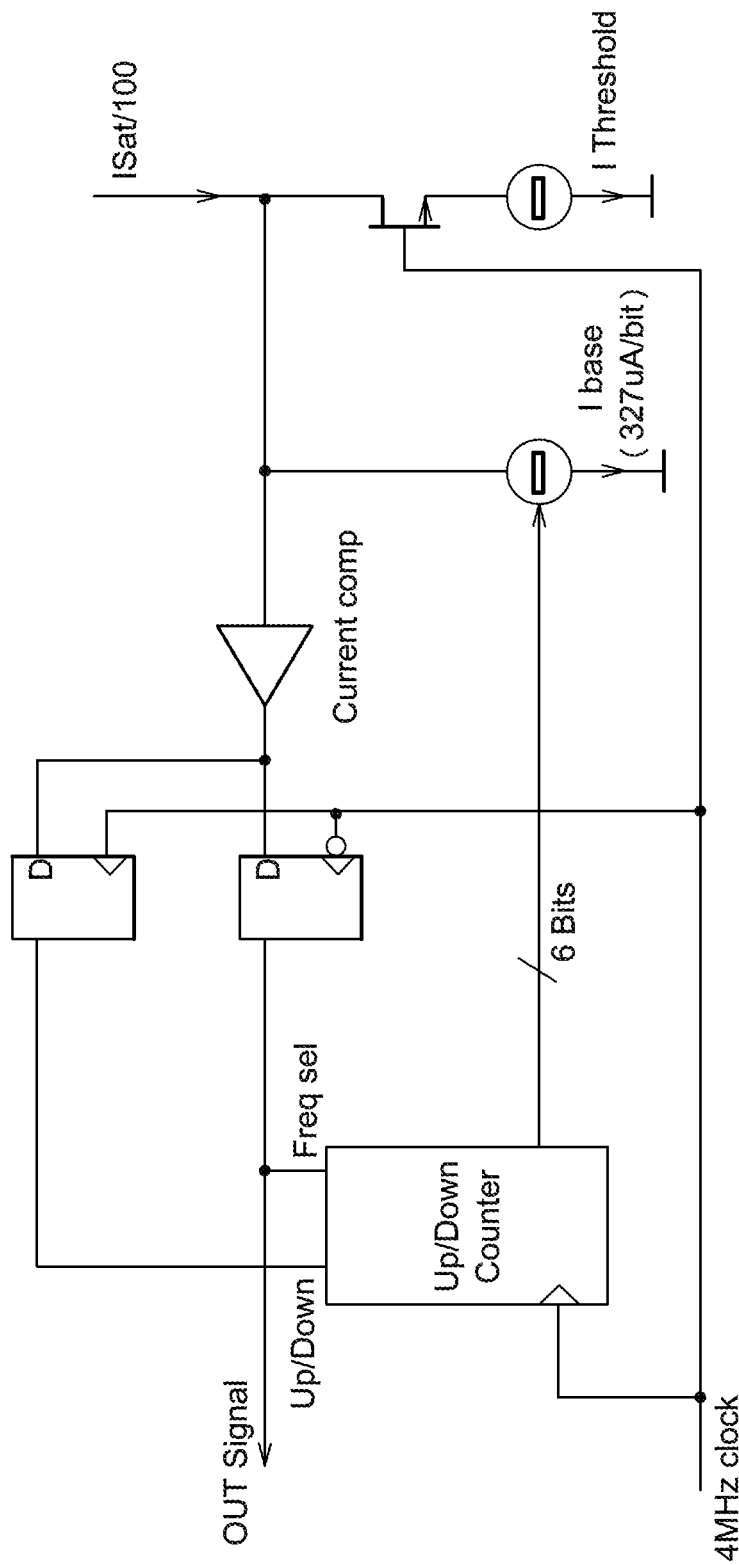
FIGS. 8a and 8b show exemplary diagrams of analog-to-digital conversion loops for PSI5 and WSS systems, respectively.
Figure 8B:
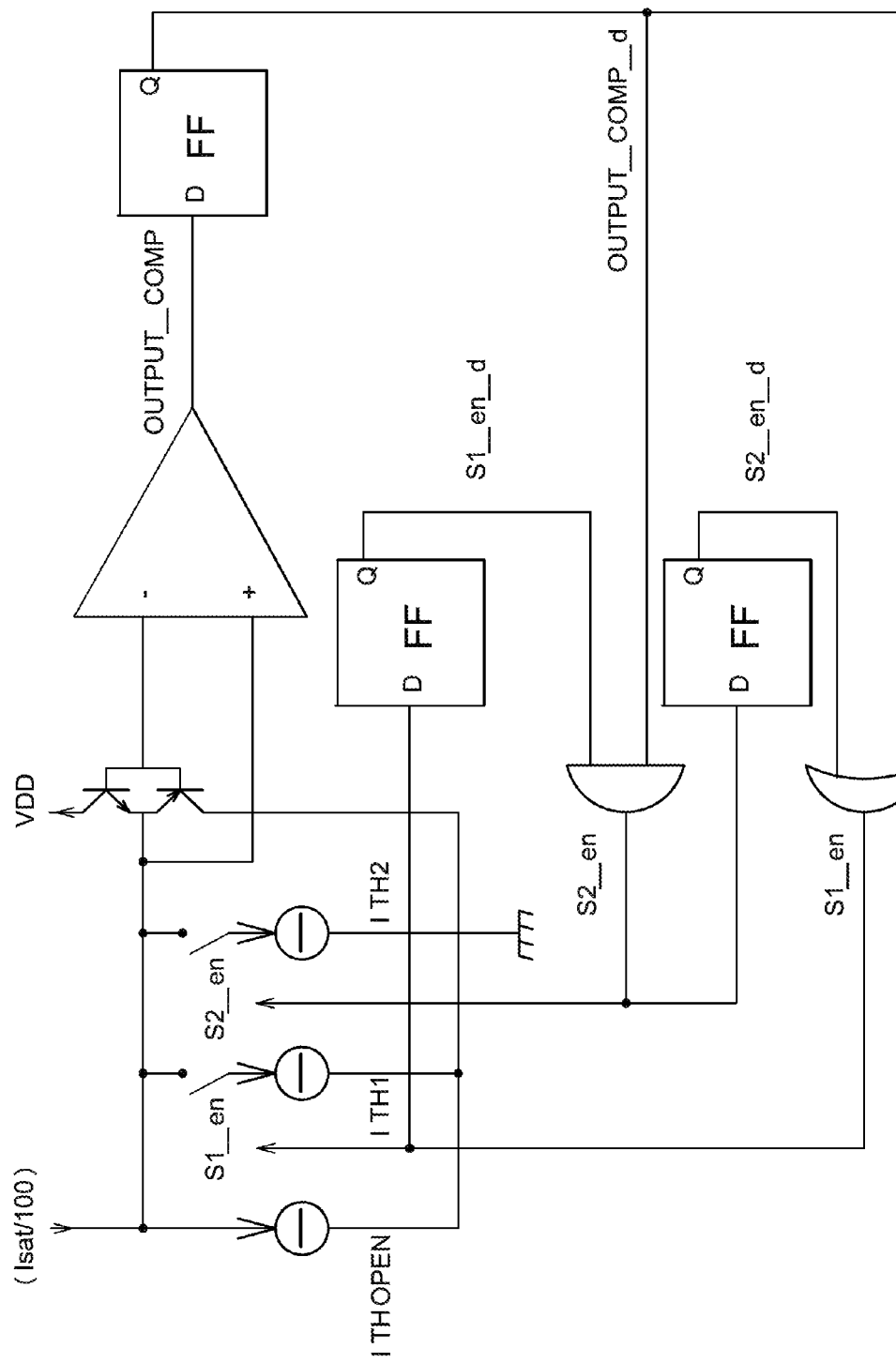
Figure 11A:
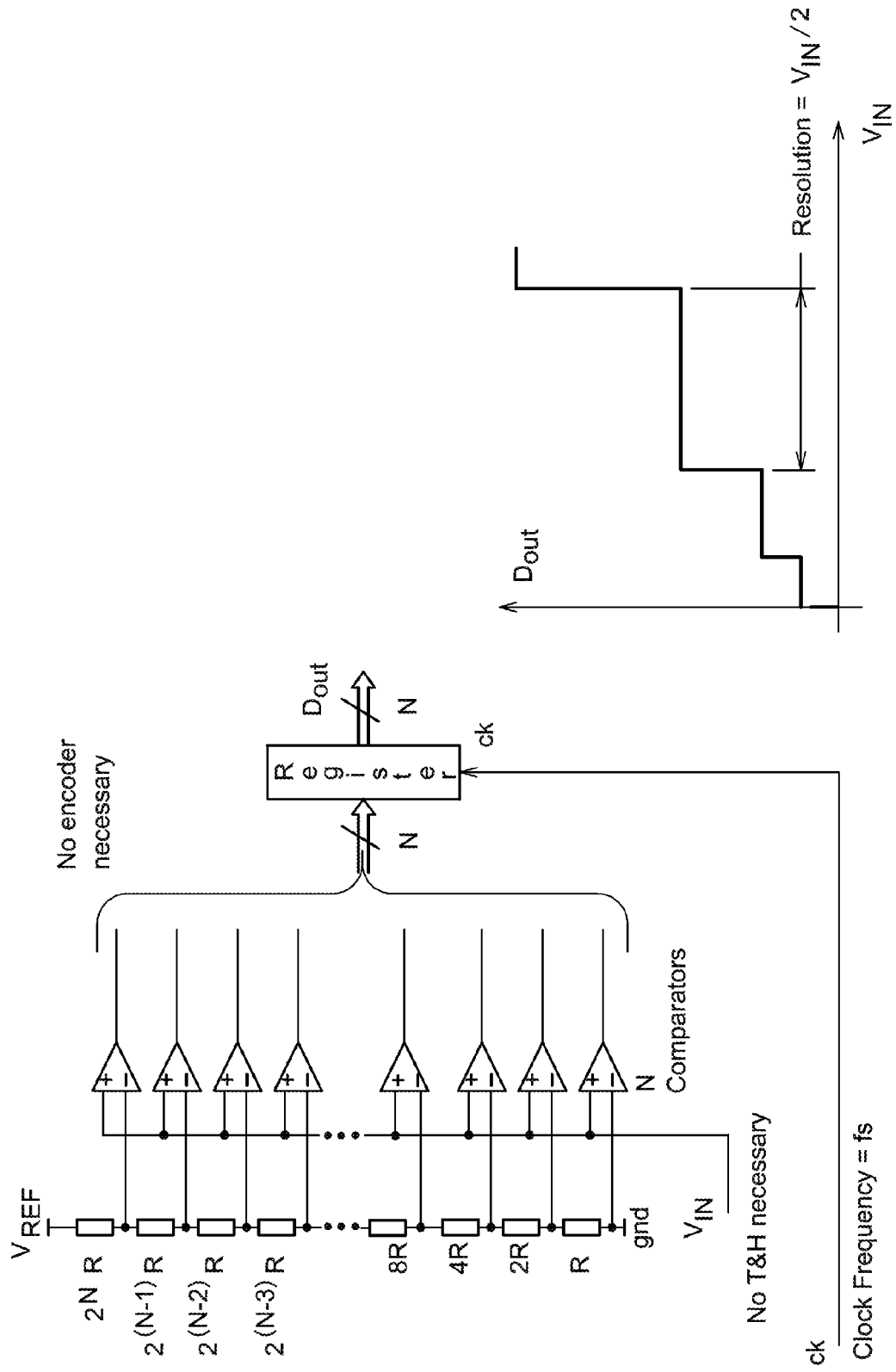
FIG. 11a and 11b show architectures of analog-to-digital voltage and current converters adapted to be used in the analog-to-digital conversion loop of this disclosure.
Figure 11B:
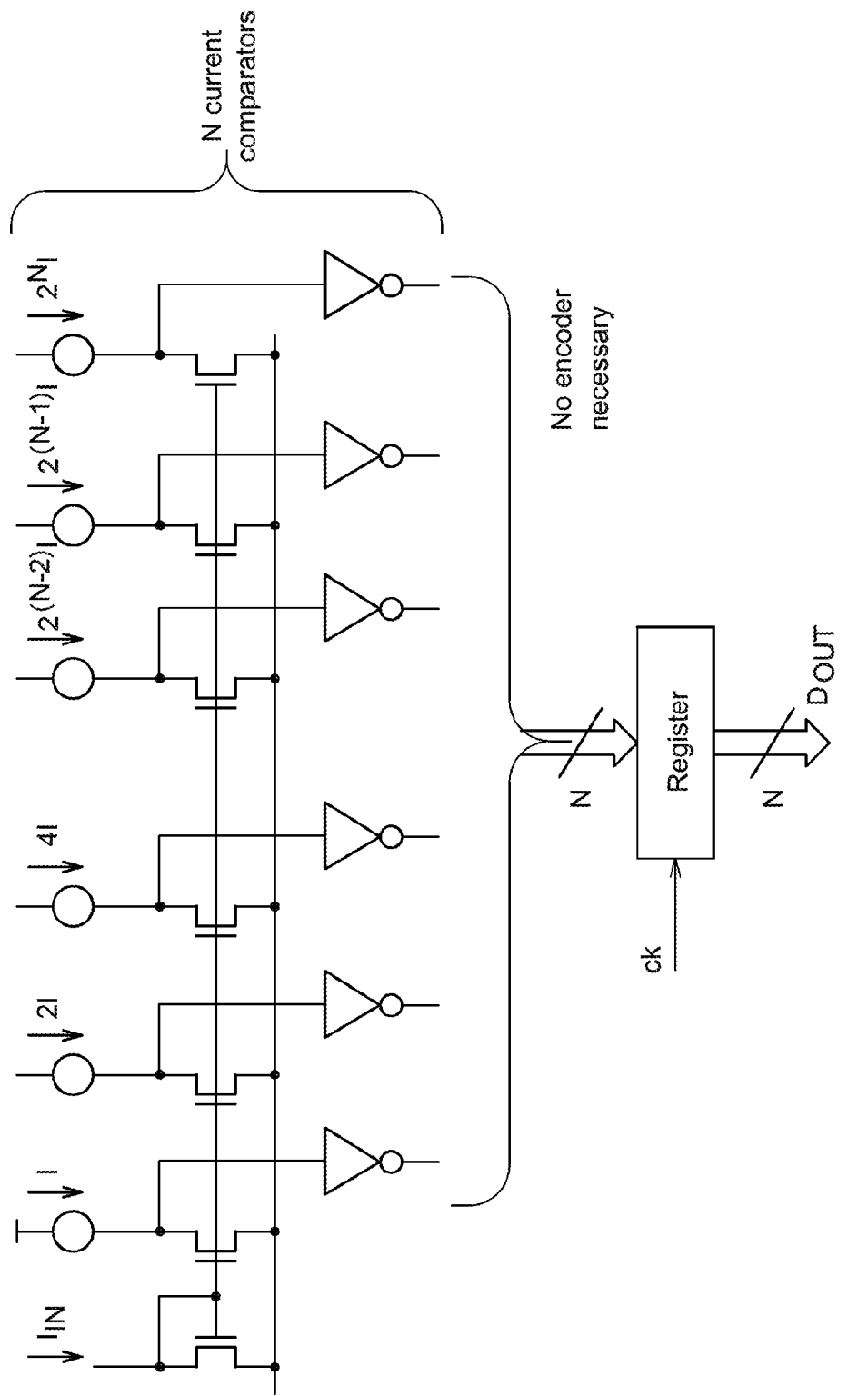

Detailed diagrams of voltage and current analog-to-digital converters with a logarithmic characteristic are shown in FIGS. 11a and 11b. The area saving compared with the analog-to-digital converter of FIG. 5 is evident, because for obtaining a dynamics equal to $2^N$, in the first case N comparators are sufficient, whilst in the second case $2^N-1$ comparators are required. Moreover, an encoder is not required to generate the output digital word DOUT, because the outputs of the comparators represent the bits—from the least significant up to the most significant—of the output DOUT.

Figure 12A:
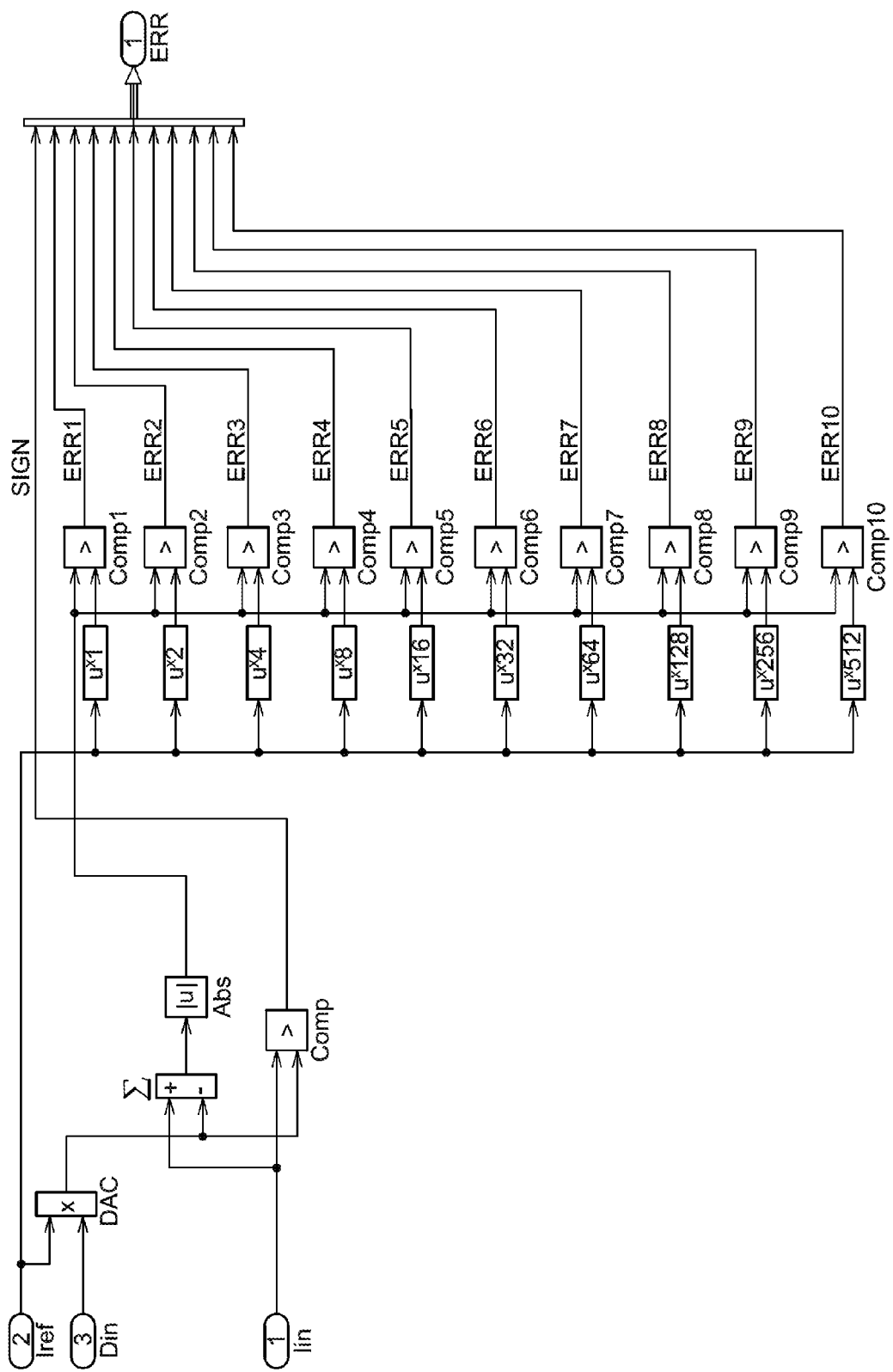
FIGS. 12a, 12b and 12c show Simulink™ schemes of the analog-to-digital conversion loop according to this disclosure, shown in FIG. 10.
Figure 12B:
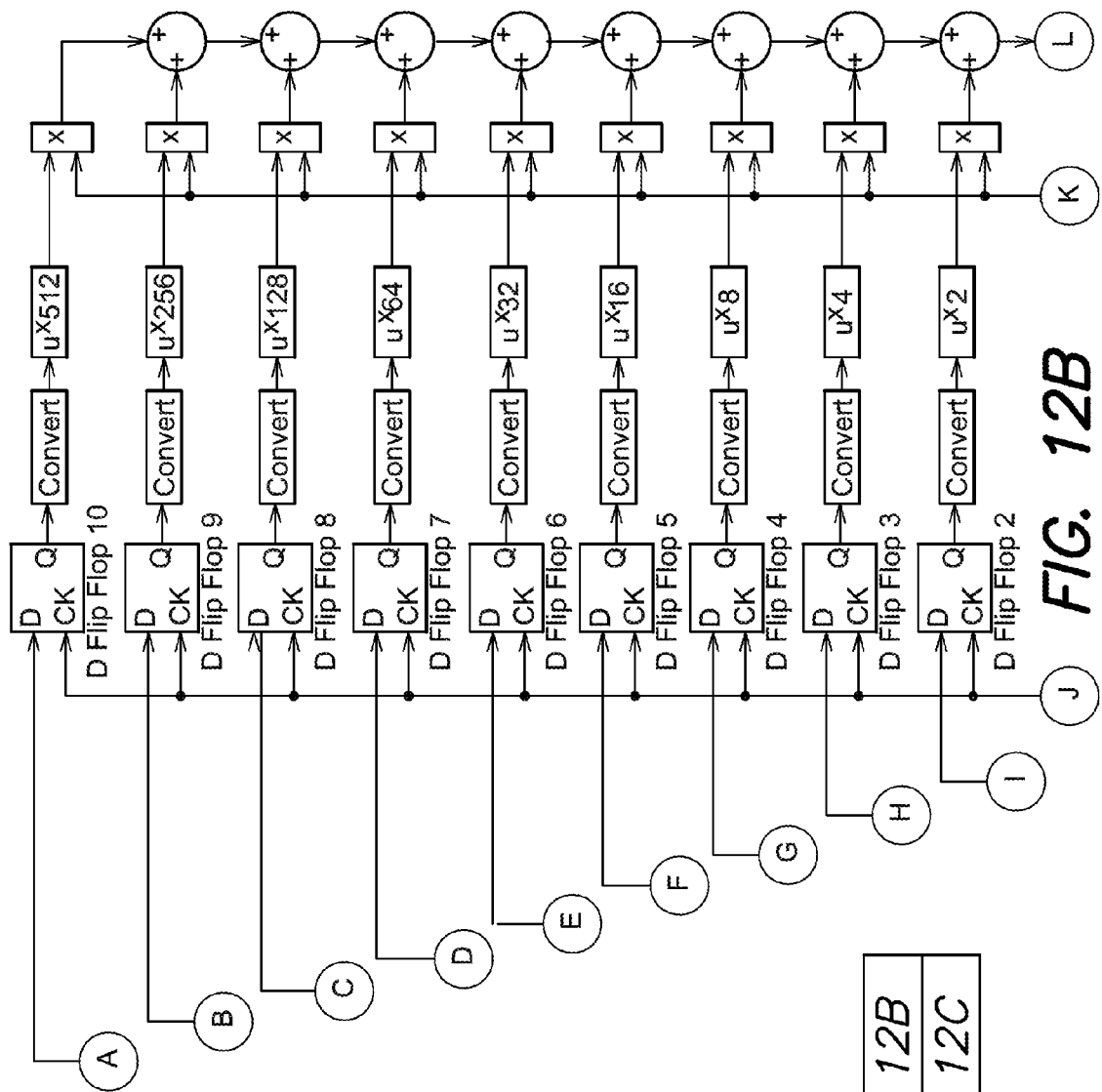
Figure 12C:
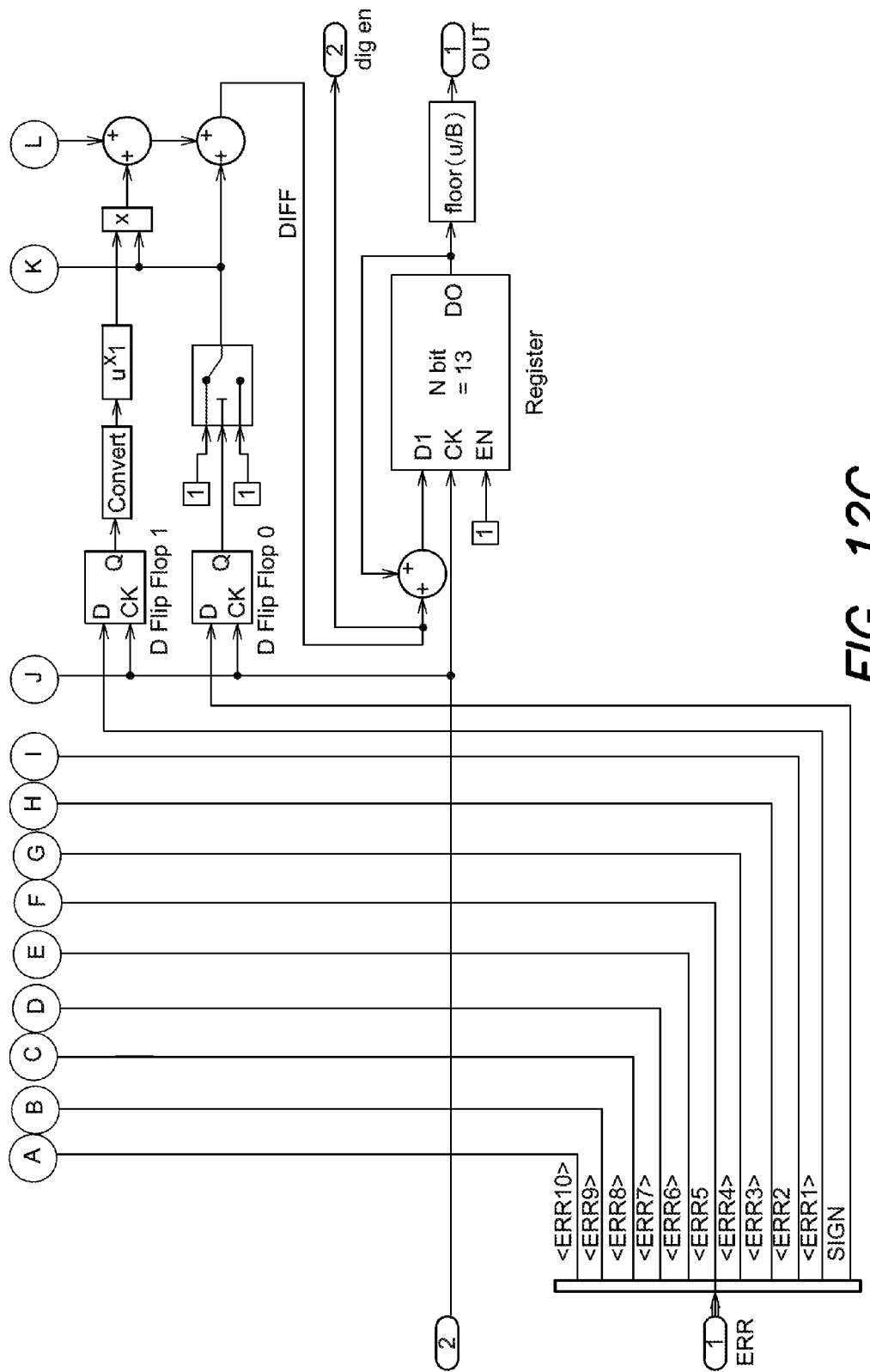

Simulink™ circuits used for simulating the functioning of the novel analog-to-digital conversion loop of FIG. 10 are shown in FIGS. 12a, 12b and 12c. The adder Σ of FIG. 12a generates an analog difference signal between the input signal to be converted Iin and an analog replica Din of the digital output signal OUT of the conversion loop. The absolute value (Abs) of this difference is compared with N thresholds (in the exemplary case shown in figure N=10) fixed according to an exponential law and added, as shown in figure, for generating a digital word ERR corresponding to this difference. The bit of this digital word ERR are weighted according to an exponential law, as shown in FIGS. 12b and 12c, for generating a digital correction value DIFF of the current counting. This digital value DIFF is summed with the output digital signal OUT generated at the previous clock cycle and stored in a buffer. When a novel active edge of a clock signal is received, this sum is uploaded in the buffer itself and constituted the current value of the digital output signal corresponding to the analog input signal.

In the embodiment shown in the just described figures, the updating of the digital output value is carried out by means of a buffer and a feedback loop, but a similar result may be obtained by means of an up/down counter whose counting is updated in function of the value DIFF.

Figure 13:
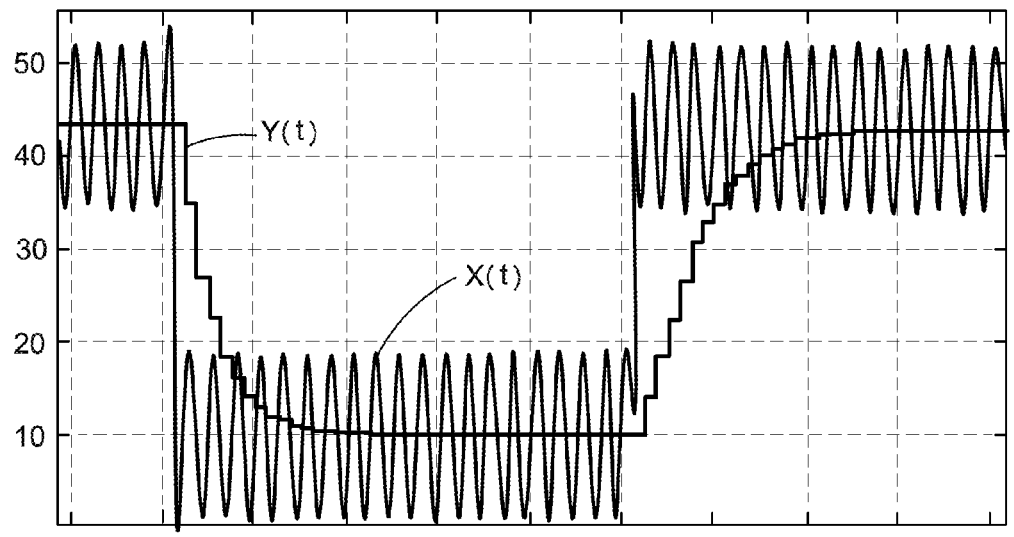
FIG. 13 is a time graph of the analog signal X(t) to be converted corrupted by noise and of the analog replica Y(t) of the corresponding digital signal generated by the conversion loop of this disclosure.

FIG. 13 is a simulation graph of the circuit shown in FIGS. 12a, 12b and 12c, that shows a square-wave signals X(t) to be converted and corrupted by noise, modeled as a high-frequency sinusoid, and an analog replica Y(t) of the corresponding digital signal. The shown exemplary values are typical of PSI5 systems, wherein the levels high and low are coded with currents of about 40 mA and 10 mA, respectively.

Figure 14A:
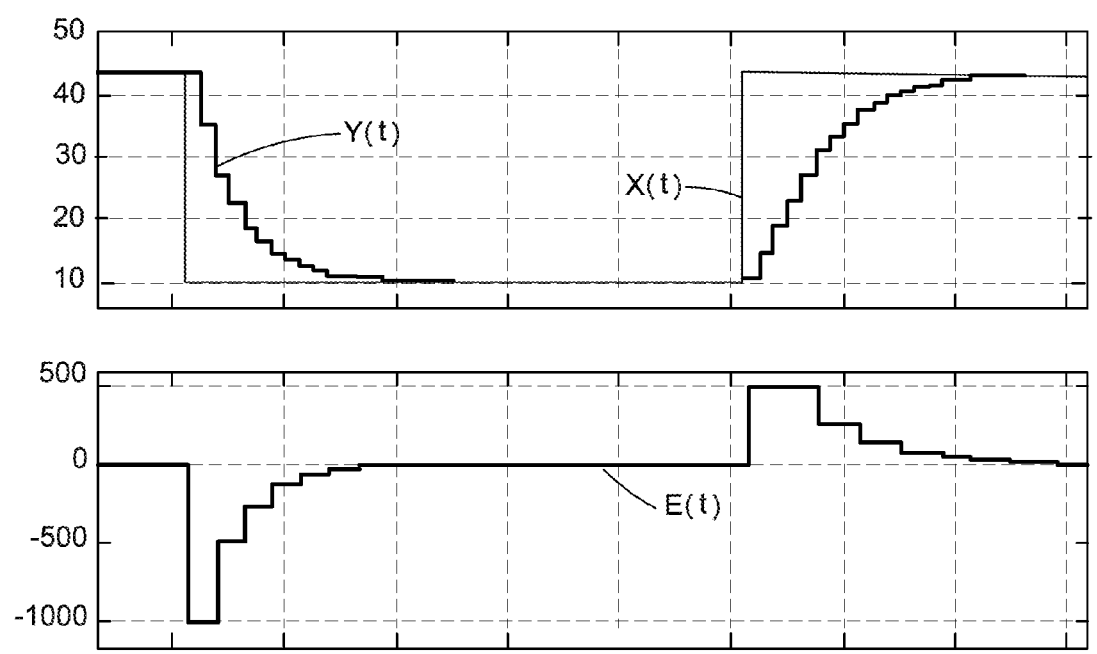
FIGS. 14a and 14b show time graphs that illustrate the transient functioning of the conversion loop of this disclosure.
Figure 14B:
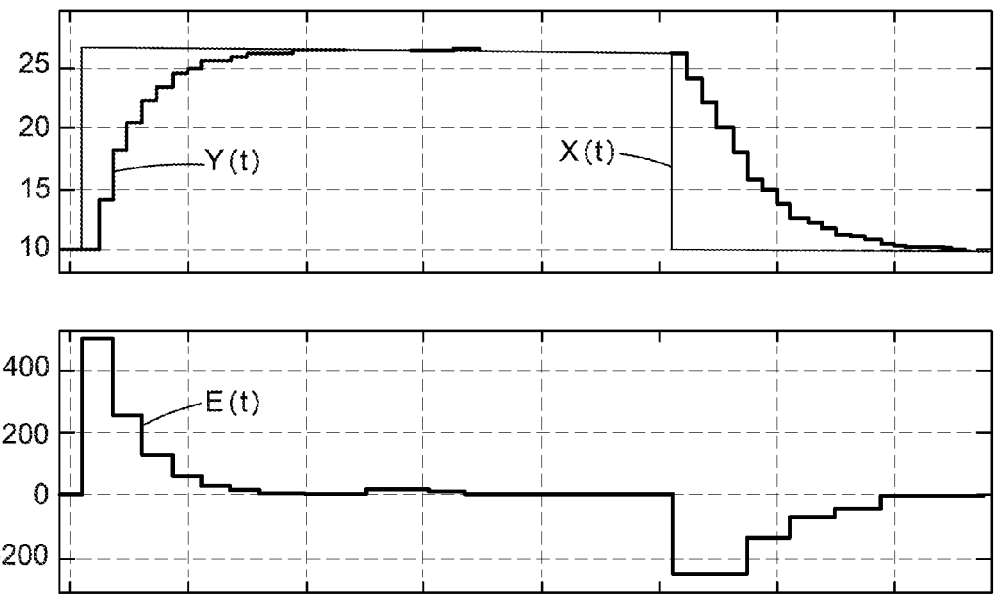

FIGS. 14a and 14b are graphs of the square-wave signal X(t) to be converted not corrupted by noise, of the analog replica Y(t) of the digital output signal and a time graph of the error E(t) during transients conditions. The herein proposed conversion loop generates a digital output signal affected by a relatively great error in correspondence of the switching of the input signal, though this error tends rapidly to the null value.

Figure 15:
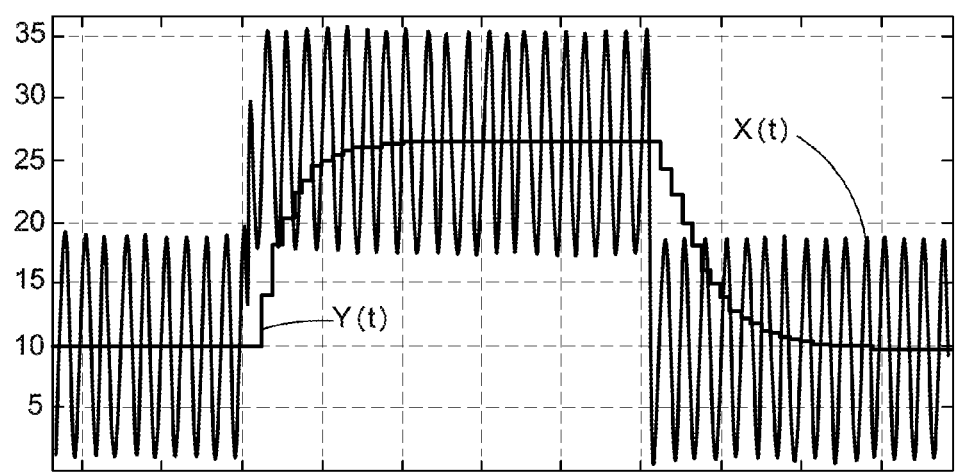
FIG. 15 is similar to FIG. 13 and shows the functioning of the conversion loop of this disclosure in a functioning condition that does not allow a threshold based discrimination.

FIG. 15 depicts a graph similar to that of FIGS. 14a and 14b in an even more critical case, wherein the peak-to-peak amplitude of noise exceeds the difference between the low logic level and the high logic level of the input signal to be converted. This case is particularly critical because it makes impossible a discrimination between the levels of the input signal through a comparison with a threshold.

The novel analog-to-digital conversion loop is thus capable of providing a digital output signal corresponding to a low-pass replica of the analog input signal, has shorter extinction times in transient conditions, as well as a refined accuracy in quasi-stationary functioning conditions. Moreover, with the same input dynamics, the herein proposed conversion loop may be implemented on silicon with a relevantly smaller area occupation than that of known conversion loops.

The herein proposed analog-to-digital conversion loop may be conveniently embedded in PSI5 interfaces of electronic control units for automotive applications and more in general in any communication channel with characteristics substantially similar to those of PSI5 or WSS systems.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. An analog-to-digital conversion loop to generate a digital output signal corresponding to a low-pass filtered replica of an analog input signal, comprising:
   an analog adder to receive said input analog signal and an analog feedback signal and to generate an analog error signal corresponding to a difference between the analog input signal and the analog feedback signal;
   a circuit to receive as input the analog error signal and to output both an absolute value error signal and a sign value, the absolute value error signal being an analog signal having the absolute value of the analog error signal and the sign value indicating whether the analog error signal is positive or negative;
   an analog-to-digital converter to receive the absolute value error signal and to generate a corresponding digital error signal, the analog-to-digital converter having a nonlinear input-output conversion characteristic defining a larger quantization step the more the absolute value error signal differs from a null value, the digital error signal having N bits and the analog-to-digital converter comprising no more than N comparators;
   a digital integrator to receive the digital error signal and the sign value, and to generate said digital output signal corresponding to a time integration of said digital error signal;
   a digital-to-analog converter to receive said digital output signal and to generate said analog feedback signal as analog replica of the digital output signal.

2. The analog-to-digital conversion loop according to claim 1, wherein said analog-to-digital converter has an exponential conversion characteristic.

3. The analog-to-digital conversion loop according to claim 1, wherein said digital integrator comprises an up and down counter to receive the digital error signal and said sign value and to generate values of the digital output signal by incrementing or decrementing a counting depending on the sign value and the value of the digital error signal.

4. The analog-to-digital conversion loop according to claim 1, wherein said digital integrator comprises a digital adder to receive the digital output signal and the digital error signal and to generate values of the digital output signal at each active edge of a clock signal as sum of a present value of a product of the digital error signal and the sign value, and a value of the digital output signal generated by a previous active edge of the clock signal.

5. An interface to be coupled with WSS sensors, comprising an analog-to-digital conversion loop according to claim 1.

6. The analog-to-digital conversion loop according to claim 1, wherein said analog-to-digital converter is a flash converter.

7. An interface for PSI5 systems, comprising an analog-to-digital conversion loop according to claim 1.

8. The analog-to-digital conversion loop according to claim 1, wherein the circuit comprises:
   a rectifier to output the absolute value error signal having the absolute value of the analog error signal; and
   a comparator to output the sign value indicating whether the analog error signal is positive or negative.

9. The analog-to-digital conversion loop according to claim 8, wherein:
   the analog-to-digital converter comprises N comparators;
   each of the N comparators is associated with a threshold and outputs an indication of whether a value of the absolute value error signal exceeds the threshold; and
   the thresholds of the N comparators follow an exponential progression.

* * * * *